United States Patent
Clark

(10) Patent No.: US 7,628,861 B2
(45) Date of Patent: Dec. 8, 2009

(54) PULSED MASS FLOW DELIVERY SYSTEM AND METHOD

(75) Inventor: William R. Clark, Hampstead, NH (US)

(73) Assignee: MKS Instruments, Inc., Wilmington, MA (US)

( * ) Notice: Subject to any disclaimer, the term of this patent is extended or adjusted under 35 U.S.C. 154(b) by 202 days.

(21) Appl. No.: 11/015,465

(22) Filed: Dec. 17, 2004

(65) Prior Publication Data

US 2006/0130744 A1 Jun. 22, 2006

(51) Int. Cl.
C23C 16/455 (2006.01)
C23C 16/52 (2006.01)
C23F 1/00 (2006.01)
H01L 21/306 (2006.01)
C23C 16/06 (2006.01)
C23C 16/22 (2006.01)

(52) U.S. Cl. .................. 118/666; 118/663; 118/689; 118/690; 118/692; 156/345.15

(58) Field of Classification Search ................. 118/666, 118/663, 689, 690, 692; 156/345.15
See application file for complete search history.

(56) References Cited

U.S. PATENT DOCUMENTS

| | | | |
|---|---|---|---|
| 4,364,413 A | 12/1982 | Bersin et al. | |
| 4,640,221 A * | 2/1987 | Barbee et al. | 118/689 |
| 4,717,596 A * | 1/1988 | Barbee et al. | 427/248.1 |
| 4,783,343 A * | 11/1988 | Sato | 427/8 |
| 4,911,101 A * | 3/1990 | Ballingall et al. | 118/715 |
| 5,225,366 A * | 7/1993 | Yoder | 117/90 |
| 5,281,274 A * | 1/1994 | Yoder | 118/697 |
| 5,281,295 A * | 1/1994 | Maeda et al. | 156/345.29 |
| 5,394,755 A * | 3/1995 | Sudo et al. | 73/861 |
| 5,500,256 A * | 3/1996 | Watabe | 427/579 |
| 5,565,038 A * | 10/1996 | Ashley | 134/2 |
| 5,849,092 A * | 12/1998 | Xi et al. | 134/1.1 |
| 5,865,205 A * | 2/1999 | Wilmer | 137/2 |
| 5,868,159 A * | 2/1999 | Loan et al. | 137/334 |
| 6,062,256 A * | 5/2000 | Miller et al. | 137/487.5 |
| 6,119,710 A * | 9/2000 | Brown | 137/14 |
| 6,125,869 A * | 10/2000 | Horiuchi | 137/1 |
| 6,503,330 B1 | 1/2003 | Sneh et al. | |
| 6,612,331 B2 * | 9/2003 | Cederstav et al. | 137/487.5 |
| 6,631,334 B2 * | 10/2003 | Grosshart | 702/50 |
| 6,638,859 B2 | 10/2003 | Sneh et al. | |
| 6,673,323 B1 * | 1/2004 | Bhatnagar et al. | 423/210 |
| 6,782,348 B2 * | 8/2004 | Ushiku | 702/183 |

(Continued)

*Primary Examiner*—Rudy Zervigon
(74) *Attorney, Agent, or Firm*—McDermott Will & Emery LLP

(57) ABSTRACT

A system for delivering pulses of a desired mass of gas, including a chamber, a first valve controlling flow into the chamber, a second valve controlling flow out of the chamber. A controller is programmed to receive the desired mass for each pulse through an input interface, close the second valve and open the first valve, receive chamber pressure measurements from a pressure transducer, and close the first valve when pressure within the chamber rises to a predetermined upper level. The controller is also programmed to deliver pulses of gas using just the second valve, wherein, for each pulse, the second valve is opened until a calculated mass for the pulse equals the desired mass for the pulse. The first valve is not required to be opened and closed for each pulse and is, therefore, used less frequently and has an extended life.

17 Claims, 6 Drawing Sheets

U.S. PATENT DOCUMENTS

| | | | |
|---|---|---|---|
| 6,820,632 B2* | 11/2004 | Ohmi et al. | 137/14 |
| 6,911,092 B2* | 6/2005 | Sneh | 118/715 |
| 6,913,031 B2* | 7/2005 | Nawata et al. | 137/12 |
| 6,958,277 B2* | 10/2005 | Pomarede et al. | 438/287 |
| 7,050,708 B2* | 5/2006 | Sandhu | 392/386 |
| 7,089,134 B2* | 8/2006 | Barros et al. | 702/114 |
| 7,094,614 B2* | 8/2006 | Armbrust et al. | 438/14 |
| 7,216,019 B2* | 5/2007 | Tinsley et al. | 700/282 |
| 7,335,396 B2* | 2/2008 | Carpenter et al. | 427/248.1 |
| 7,428,373 B2* | 9/2008 | Sandhu | 392/386 |
| 7,434,477 B2* | 10/2008 | Lull et al. | 73/861 |
| 7,474,968 B2* | 1/2009 | Ding et al. | 702/45 |
| 2002/0007790 A1* | 1/2002 | Park | 118/715 |
| 2002/0022087 A1 | 2/2002 | Satake et al. | |
| 2002/0094681 A1* | 7/2002 | Armbrust et al. | 438/680 |
| 2002/0098627 A1* | 7/2002 | Pomarede et al. | 438/149 |
| 2002/0195145 A1* | 12/2002 | Lowery et al. | 137/487.5 |
| 2003/0094136 A1* | 5/2003 | Bartholomew et al. | 118/715 |
| 2003/0180458 A1* | 9/2003 | Sneh | 427/248.1 |
| 2004/0015300 A1* | 1/2004 | Ganguli et al. | 702/24 |
| 2004/0226507 A1* | 11/2004 | Carpenter et al. | 118/715 |
| 2004/0244837 A1* | 12/2004 | Nawata et al. | 137/487.5 |
| 2005/0081786 A1* | 4/2005 | Kubista et al. | 118/715 |
| 2005/0126483 A1* | 6/2005 | Tognetti | 118/715 |
| 2005/0160983 A1* | 7/2005 | Sneh | 118/715 |
| 2005/0199342 A1* | 9/2005 | Shajii et al. | 156/345.26 |
| 2005/0223979 A1* | 10/2005 | Shajii et al. | 118/692 |
| 2005/0249876 A1* | 11/2005 | Kawahara et al. | 427/255.34 |
| 2006/0130744 A1* | 6/2006 | Clark | 117/86 |
| 2007/0039549 A1* | 2/2007 | Shajii et al. | 118/715 |

* cited by examiner

PULSED MASS FLOW DELIVERY SYSTEM AND METHOD

CROSS-REFERENCE TO RELATED APPLICATIONS

The present application is related to co-pending application Ser. No. 11/223,366, filed on Sep. 9, 2005 and co-pending application Ser. No. 10/822,358, filed on Apr. 12, 2004, both of which are assigned to the assignee of the present application and incorporated herein by reference.

FIELD OF THE DISCLOSURE

The present disclosure relates generally to semiconductor manufacturing equipment and, more particularly, to systems and methods for delivering precise quantities of process gases to semiconductor processing chambers. Even more particularly, the present disclosure relates to a system and method for delivering pulsed mass flow of precursor gases into semiconductor processing chambers.

BACKGROUND OF THE DISCLOSURE

The manufacture or fabrication of semiconductor devices often requires the careful synchronization and precisely measured delivery of as many as a dozen gases to a process chamber. Various recipes are used in the manufacturing process, and many discrete processing steps, where a semiconductor device is cleaned, polished, oxidized, masked, etched, doped, metalized, etc., can be required. The steps used, their particular sequence, and the materials involved all contribute to the making of particular devices.

As device sizes continue to shrink below 90 nm, the semiconductor roadmap suggests that atomic layer deposition, or ALD processes will be required for a variety of applications, such as the deposition of barriers for copper interconnects, the creation of tungsten nucleation layers, and the production of highly conducting dielectrics. In the ALD process, two or more precursor gases flow over a wafer surface in a process chamber maintained under vacuum. The two or more precursor gases flow in an alternating manner, or pulses, so that the gases can react with the sites or functional groups on the wafer surface. When all of the available sites are saturated from one of the precursor gases (e.g., gas A), the reaction stops and a purge gas is used to purge the excess precursor molecules from the process chamber. The process is repeated, as the next precursor gas (i.e., gas B) flows over the wafer surface. A cycle is defined as one pulse of precursor A, purge, one pulse of precursor B, and purge. This sequence is repeated until the final thickness is reached. These sequential, self-limiting surface reactions result in one monolayer of deposited film per cycle.

The pulses of precursor gases into the processing chamber is normally controlled using on/off-type valves which are simply opened for a predetermined period of time to deliver a desired amount of precursor gas into the processing chamber. The amount of material (mass) flowing into the process chamber is not actually measured.

What is still desired is a new and improved system and method for measuring and delivering pulsed mass flow of precursor gases into semiconductor processing chambers. Preferably, the system and method will actually measure the amount of material (mass) flowing into the process chamber, and provide reliable measurements. In addition, the system and method will preferably provide highly repeatable and precise quantities of gaseous mass for use in semiconductor manufacturing processes, such as atomic layer deposition (ALD) processes.

Furthermore, the system and method for measuring and delivering pulsed mass flow of precursor gases will preferably be designed to extend the life of valves used by the system and method. In addition, the system and method will preferably provide back-up or secondary valves for operation in the event a primary valve of the system should fail, so that the system and method are even more reliable and downtime of semiconductor processing chambers using the system and method is minimized.

SUMMARY OF THE DISCLOSURE

The present disclosure provides a system for delivering pulses of gas, wherein each pulse is a desired mass. The system includes a chamber, a first valve controlling gas flow into the chamber, a second valve controlling gas flow out of the chamber, a pressure transducer providing measurements of pressure within the chamber, a temperature probe providing measurements of temperature within the chamber, an input interface for providing a desired mass set point for each pulse of gas to be delivered by the system, and a controller connected to the valves, the pressure transducer and the input interface. The controller is programmed to receive the desired mass for each pulse through the input interface, close the second valve and open the first valve, receive chamber pressure measurements from the pressure transducer, and close the first valve when pressure within the chamber rises to a predetermined upper level.

The controller is also programmed to deliver pulses of gas using just the second valve, wherein each pulse is equal to the desired mass, until pressure within the chamber falls to a predetermined lower level. Once pressure within the chamber falls to the predetermined lower level, the controller is programmed to close the second valve and open the inlet valve until pressure within the chamber rises to the predetermined upper level. Pulses of gas can then again be delivered by the controller using just the second valve.

The present disclosure, accordingly, provides a new and improved system and method for delivering pulsed mass flow of precursor gases wherein the first, or inlet, valve of the system is used less frequently, so that the inlet valve will have an extended life. The first valve is not required to be opened and closed for each pulse and is, therefore, used less frequently. According to one aspect of the present disclosure, the second, or outlet, valve of the system is provided with a back-up valve to be utilized upon failure of the outlet valve, so that the system is even more reliable and downtime of semiconductor processing chambers using the system is minimized.

Among further aspects and advantages, the present disclosure provides a new and improved system and method for delivering pulsed mass flow of precursor gases into semiconductor processing chambers. The mass flow delivery system and method actually measures the amount of material (mass) flowing into the process chamber. In addition, the system and method provide highly repeatable and precise quantities of gaseous mass for use in semiconductor manufacturing processes, such as atomic layer deposition (ALD) processes.

Additional aspects and advantages of the present disclosure will become more readily apparent to those skilled in this art from the following detailed description, wherein an exemplary embodiment of the present disclosure is shown and described, simply by way of illustration. As will be realized, the present disclosure is capable of other and different embodiments and its several details are capable of modifications in various obvious respects, all without departing from the disclosure. Accordingly, the drawings and description are to be regarded as illustrative in nature, and not as restrictive.

BRIEF DESCRIPTION OF THE DRAWINGS

Reference is made to the attached drawings, wherein elements having the same reference characters represent like elements throughout, and wherein.

DETAILED DESCRIPTION OF EXEMPLARY EMBODIMENTS

Figure 1:
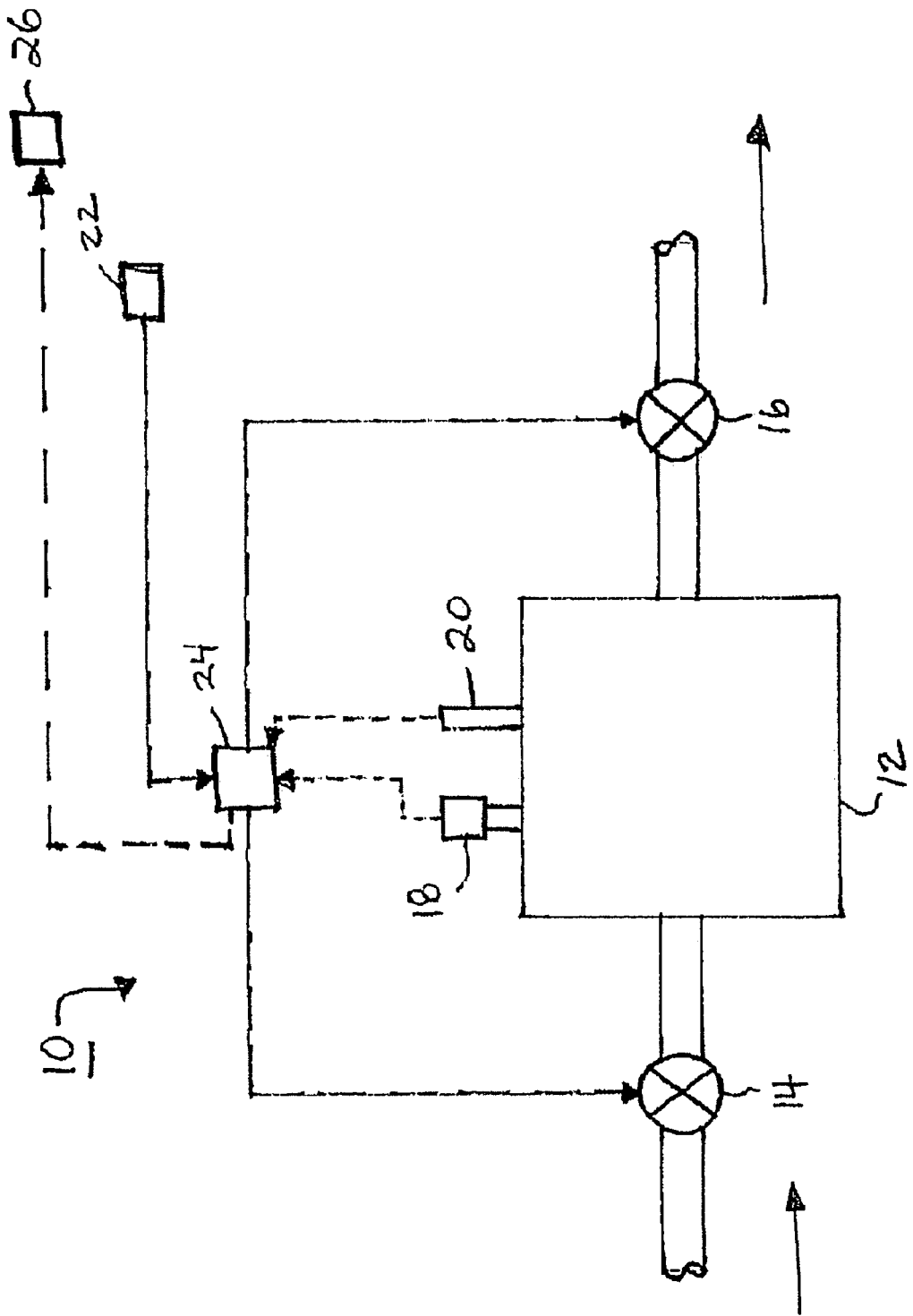
FIG. 1 is a schematic illustration of an exemplary embodiment of a pulsed mass flow delivery system constructed in accordance with the present disclosure.
Figure 3:
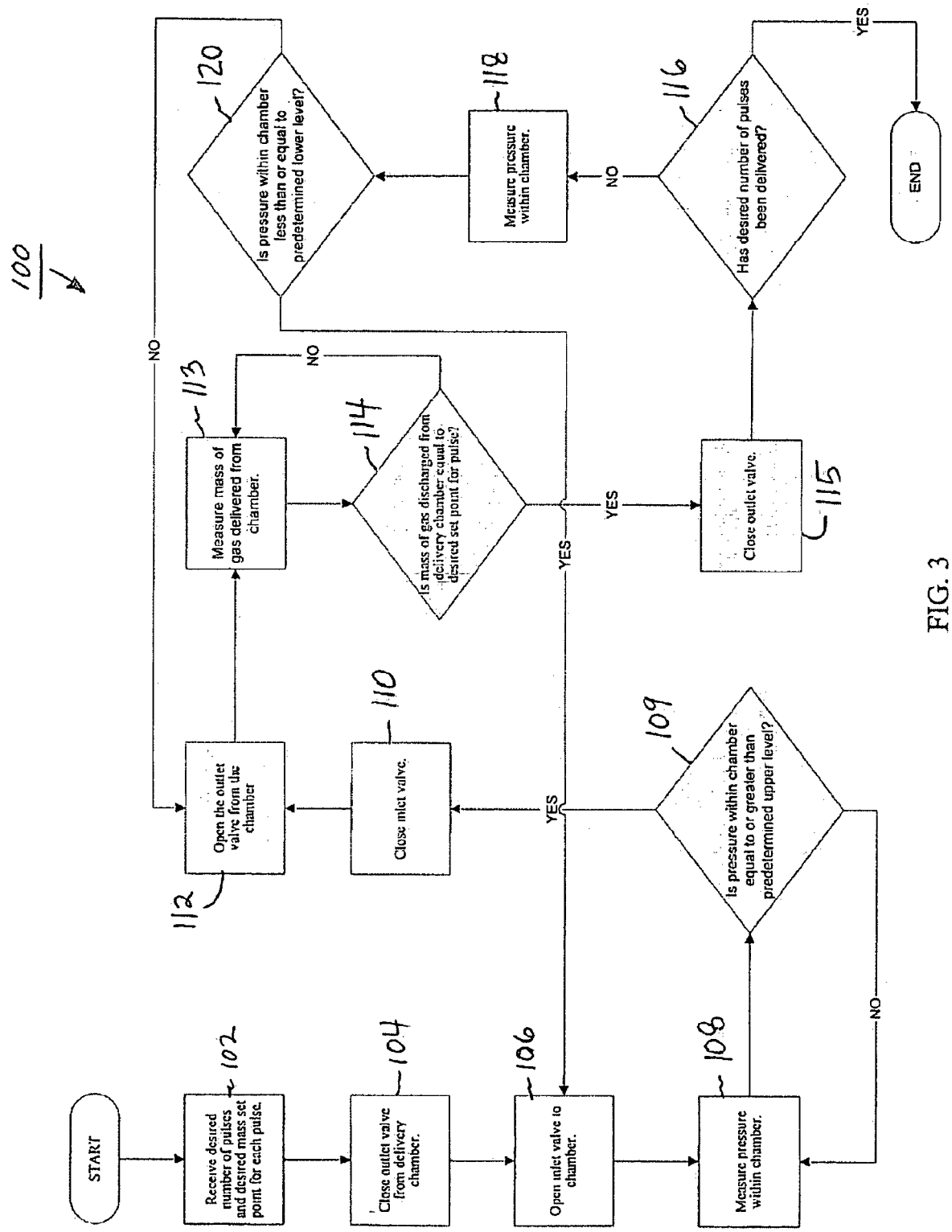
FIG. 3 is a flow chart illustrating an exemplary embodiment of a method for delivering pulsed mass flows in accordance with the present disclosure, wherein the method can be used to operate the pulsed mass flow delivery system of FIG. 1.

Referring to FIG. 1, the present disclosure provides an exemplary embodiment of a mass flow delivery system 10, and, in FIG. 3, the present disclosure provides an exemplary embodiment of a method 100 for delivering mass flow. The system 10 and method 100 are particularly intended for delivering contaminant-free, precisely metered quantities of process gases to semiconductor process chambers. The mass flow delivery system 10 and method 100 actually measure the amount of material (mass) flowing into the process chamber. In addition, the system and method provide highly repeatable and precise quantities of gaseous mass for use in semiconductor manufacturing processes, such as atomic layer deposition (ALD) processes. Prior to describing the system 10 and method 100 of the present disclosure, however, an example of an atomic layer deposition apparatus is first described to provide background information.

Figure 8:
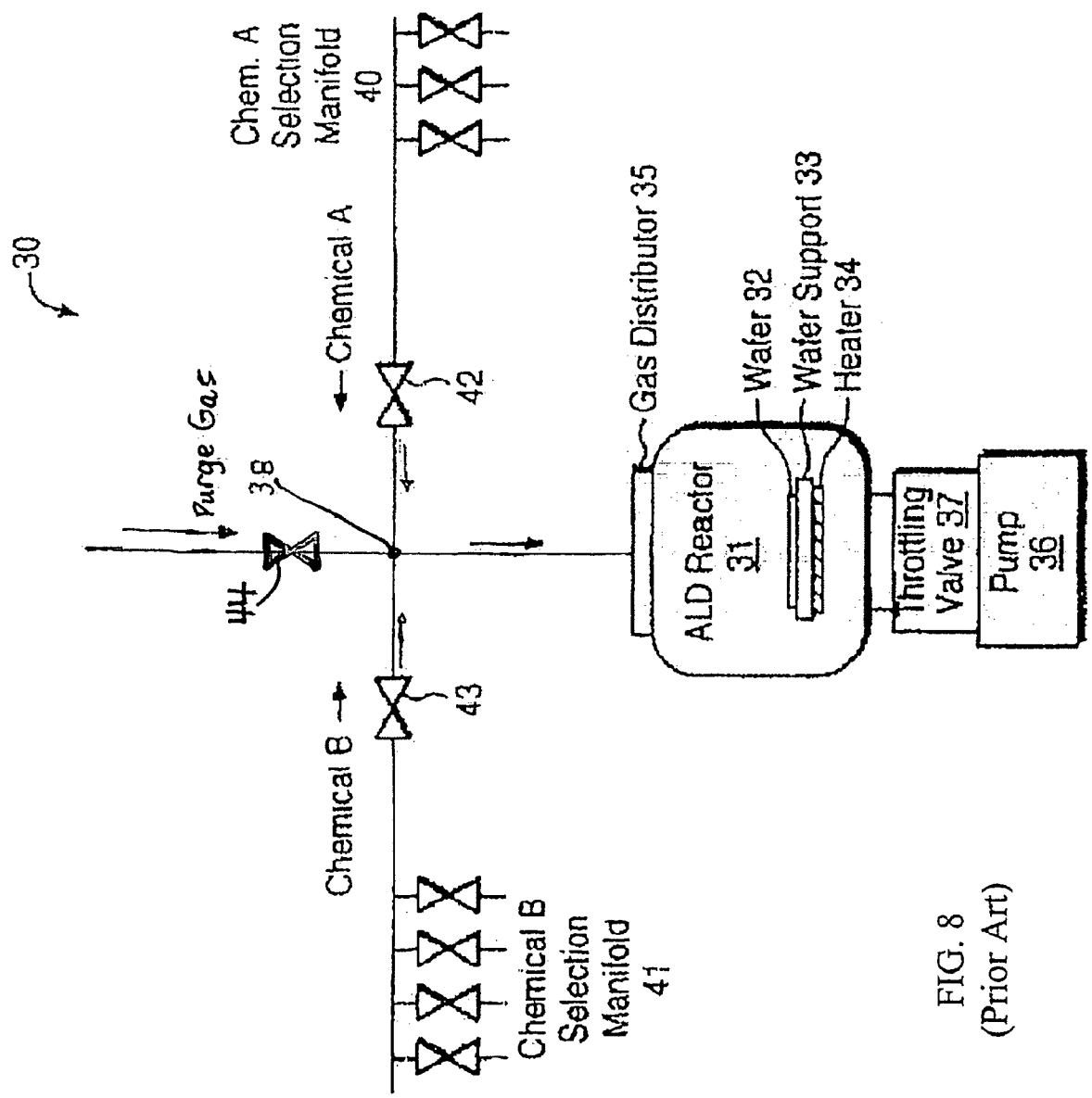
FIG. 8 is a schematic illustration of an exemplary embodiment of an atomic layer deposition system constructed in accordance with the prior art.

FIG. 8 is a schematic illustration of an exemplary embodiment of an atomic layer deposition system 30 constructed in accordance with the prior art. The system 30 includes a processing chamber 31 for housing a semiconductor wafer or substrate 32. Typically, the wafer 32 resides atop a support (or chuck) 33 and a heater 34 is coupled to the chuck to heat the chuck 33 and the wafer 32 for plasma deposition. The processing gases are introduced into the chamber 31 through a gas distributor 35 located at one end of the chamber 31. A vacuum pump 36 is located at the opposite end to draw gas flow across the wafer surface. A throttling valve 37 may be provided to regulate the pressure within the process chamber.

A variety of chemical vapor deposition (CVD) techniques for combining gases can be utilized, including adapting techniques known in the art. Although not shown, the gases may also be made into a plasma. The system 30 also includes a multi-way connector 38 for directing the various processing gases and purge gases into the gas distributor 35 and into the processing chamber 31.

The multi-way connector 38 has two inlets for the introduction of gases and chemicals, and an inlet for introduction of a purge gas. The purge gas is typically an inert gas, such as nitrogen. In the example diagram of FIG. 7, chemical A and chemical B are shown combined with the purge gas. Chemistry A pertains to a first precursor gas and chemistry B pertains to a second precursor gas for performing atomic layer deposition on the semiconductor wafer 32 contained in the process chamber 31. Chemical selection manifolds 40 and 41, comprised of a number of on/off valves, provide for the selecting of chemicals that can be used as precursor gases A and B, respectively. On/off-type valves 42 and 43 respectively regulate the introduction of the precursor gases A and B into the multi-way connector 38.

Once the wafer 32 is resident within the processing chamber 31, the chamber environment is brought up to meet desired parameters. For example, the temperature of the semiconductor wafer 32 is increased in order to perform atomic layer deposition. When atomic layer deposition is to be performed, the valve 42 is opened to allow the first precursor to be introduced into the process chamber 31. After a preselected period of time, the valve 42 is closed, valve 44 is opened, and the purge gas purges any remaining reactive species from the process chamber 31. Then, after another preselected time, the valve 44 is closed to stop the purge gas, and the valve 43 is opened to introduce the second precursor into the process chamber 31. Again after another preselected time, the valve 43 is closed, the valve 44 is opened, and the purge gas purges the reactive species from the process chamber 31. The two chemicals A and B are alternately introduced into the carrier flow stream to perform the atomic layer deposition cycle to deposit a film layer on the semiconductor wafer 32.

Thus, the pulses of precursor gases into the processing chamber 31 are controlled using the on/off type valves 42, 43 and 44, which are simply opened for a predetermined period of time to deliver a desired amount of precursor gas into the processing chamber 31. The amount of material (mass) flowing into the process chamber is not actually measured. Instead, pressures in the manifolds 40, 41 and the valve 42, 43 on/off time periods are controlled to estimate the mass flow. The mass flow delivery system 10 and method 100 of the present disclosure, however, actually measure the amount of material (mass) flowing into the process chamber as opposed to controlling flow rates to estimate mass flow. The system 30 shown includes two precursor gases, but can include more than two sources (e.g., eight or ten precursor gases).

Referring again to FIG. 1, the presently disclosed mass flow delivery system 10 includes a delivery chamber 12, a first valve 14 controlling mass flow into the chamber 12, and a second valve 16 controlling mass flow out of the chamber 12. According to one exemplary embodiment of the present disclosure, the first and the second valves 14, 16 comprise on/off type valves, and at least the second or outlet valve 16 has a relatively very fast response time of about 1 to 5 milliseconds, for example.

The mass flow delivery system 10 also has a pressure transducer 18 for providing measurements of pressure within the chamber 12 and a temperature sensor 20 for providing measurements of temperature on or within the chamber 12. The pressure transducer 18 also has a relatively very fast response time of about 1 to 5 milliseconds, for example. According to one exemplary embodiment of the present disclosure, the temperature sensor 20 is in contact with, and provides measurements of the temperature of, a wall of the chamber 12.

Examples of a suitable pressure transducer 18 for use with the delivery system 10 of the present disclosure are Baratron® brand pressure transducers available from the assignee of the present disclosure, MKS Instruments of Andover, Mass. (http://www.mksinst.com). Suitable valves 14, 16 are also available from the assignee.

An input device 22 of the mass flow delivery system 10 receives a desired mass flow contained in each pulse of precursor gas (either directly from a human operator or indirectly through a wafer processing computer controller), and a computer controller (i.e., computer processing unit or "CPU") 24 is connected to the pressure transducer 18, the temperature sensor 20, the valves 14, 16 and the input interface 22. The input interface 22 can also be used to input other processing instructions, such as the number of pulses to be delivered. An output interface 26 is connected to the controller 24 and provides an indication (either directly from a human operator or indirectly through a wafer processing computer controller) of the mass delivered by the system 10. The input and the output interfaces 22, 26 may be combined into a single unit, and may connect to a personal computer with a keyboard and monitor.

Figure 2:
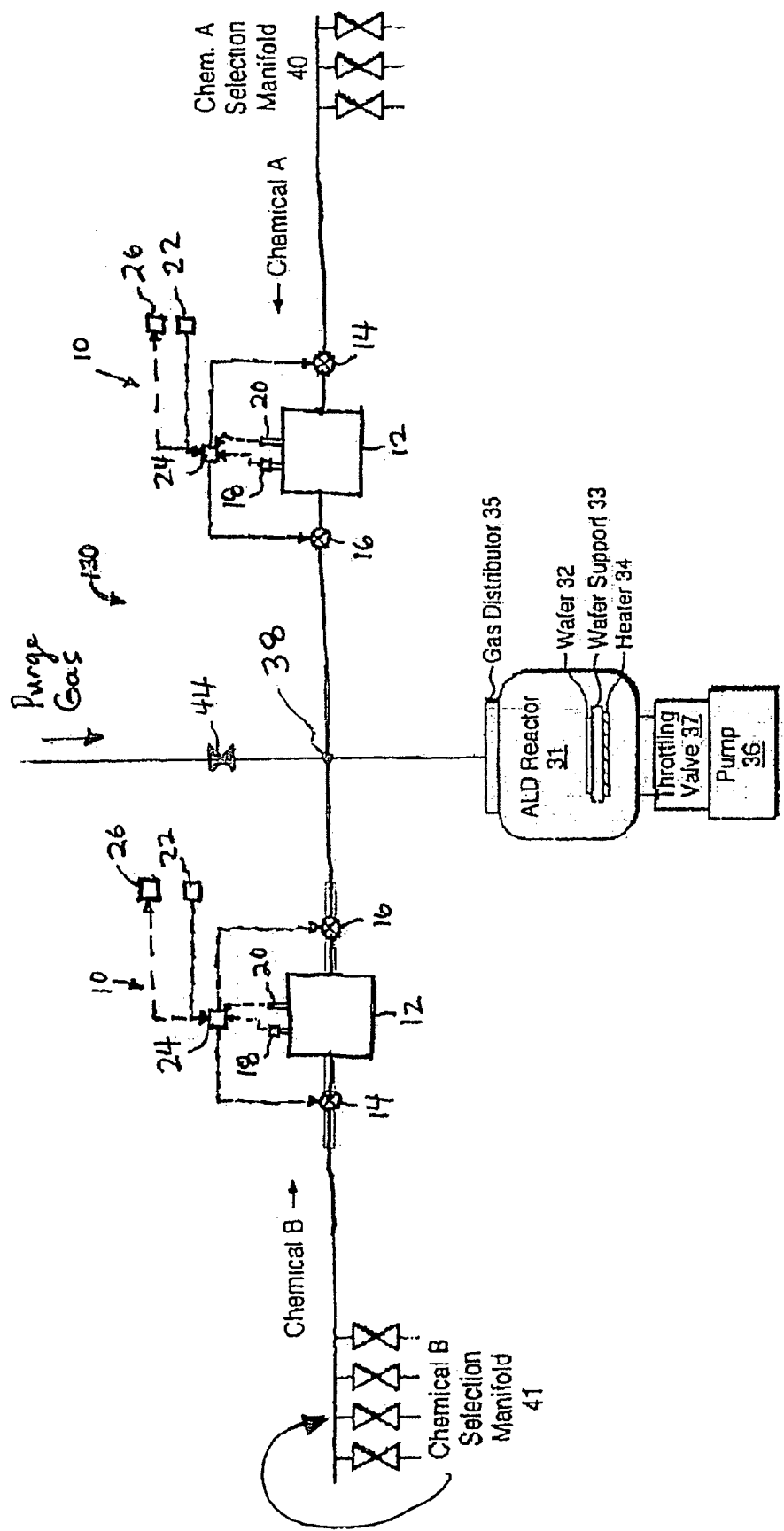
FIG. 2 is a schematic illustration of an exemplary embodiment of an atomic layer deposition system including two of the pulsed mass flow delivery systems of FIG. 1.

As shown in FIG. 2, an atomic layer deposition system 130 including two of the mass flow delivery systems 10 of FIG. 1 can be provided. The atomic layer deposition system 130 is similar to the prior art atomic layer deposition system 30 of FIG. 8, such that similar elements share the same reference numerals. The atomic layer deposition system 130 of FIG. 2, however, includes two of the mass flow delivery systems 10 of FIG. 1 for respectively regulating the introduction of the precursor gases A and B into the multi-way connector 38.

According to one exemplary embodiment of the disclosure, the controller 24 of the mass flow delivery systems 10 of FIG. 1 carries out the method 100 of FIG. 3. Referring to FIGS. 1 and 3, upon starting the controller 24 is programmed to receive the desired mass flow (i.e., set point) contained in each pulse of precursor gas through the input interface 22, as shown at 102 of FIG. 3. The controller 24 can also be programmed to receive a desired number of pulses, as shown at 102. (Alternatively, a wafer processing computer controller may determine the number of pulses required in-situ by measuring the thickness of the layer being formed in the chamber and instruct the controller 24 to stop producing pulses of gas upon the layer reaching a desired thickness.)

The controller 24 is also programmed to close the outlet valve 16, as shown at 104 of FIG. 3, open the first or inlet valve 14 to the chamber 12, as shown at 106 of FIG. 3, measure pressure within the chamber using the pressure transducer 18, as shown at 108 of FIG. 3, and close the inlet valve 14 if and when pressure within the chamber 12 reaches a predetermined upper level, as shown at 109 and 110 of FIG. 3. The predetermined upper level of pressure is user defined and can be provided through the input interface 22. The predetermined level of pressure can comprise, for example, 20 torr.

The controller 24 may also be programmed to then pause for a predetermined waiting period, wherein the gas inside the chamber 12 can approach a state of equilibrium, before opening the outlet valve 16, as shown at 112 of FIG. 3, to discharge a mass of gas from the chamber 12. The predetermined waiting period is user defined and can be provided through the input interface 22. The predetermined waiting period can comprise, for example, 3 seconds.

After the outlet valve is opened at 112, the mass of gas delivered from the chamber is measured, as shown at 113 of FIG. 3, and the outlet valve 16 is then closed when the mass of gas discharged equals the desired mass flow for each pulse, as shown at 114 and 115 of FIG. 3. The outlet valve 16 is generally opened for only a very short period (e.g., 100 to 500 milliseconds). The controller 24 then provides the mass of gas discharged to the output interface 26.

The controller 24 is further programmed to check if the desired number of pulses has been delivered, as shown at 116. If the desired number of pulses has been delivered, the controller is programmed to stop or "END", as shown.

If the desired number of pulses has not been delivered, the controller is programmed to measure the pressure within the chamber, as shown at 118 of FIG. 3, and check if the pressure within the chamber is less than or equal to a predetermined lower level, as shown at 120. The predetermined lower level of pressure is user defined and can be provided through the input interface 22. The predetermined lower level of pressure can comprise, for example, 4 torr.

If the pressure within the chamber is less than or equal to the predetermined lower level, then the controller is programmed to refill the chamber, as shown at 106-110, and continue delivering pulses of gas, as shown at 112-115. If the pressure within the chamber is greater than the predetermined lower level, then the controller is programmed to deliver another pulse of gas, as shown at 112-115, after a pause to allow the other precursor gases and purge gas to be delivered.

Figure 4:
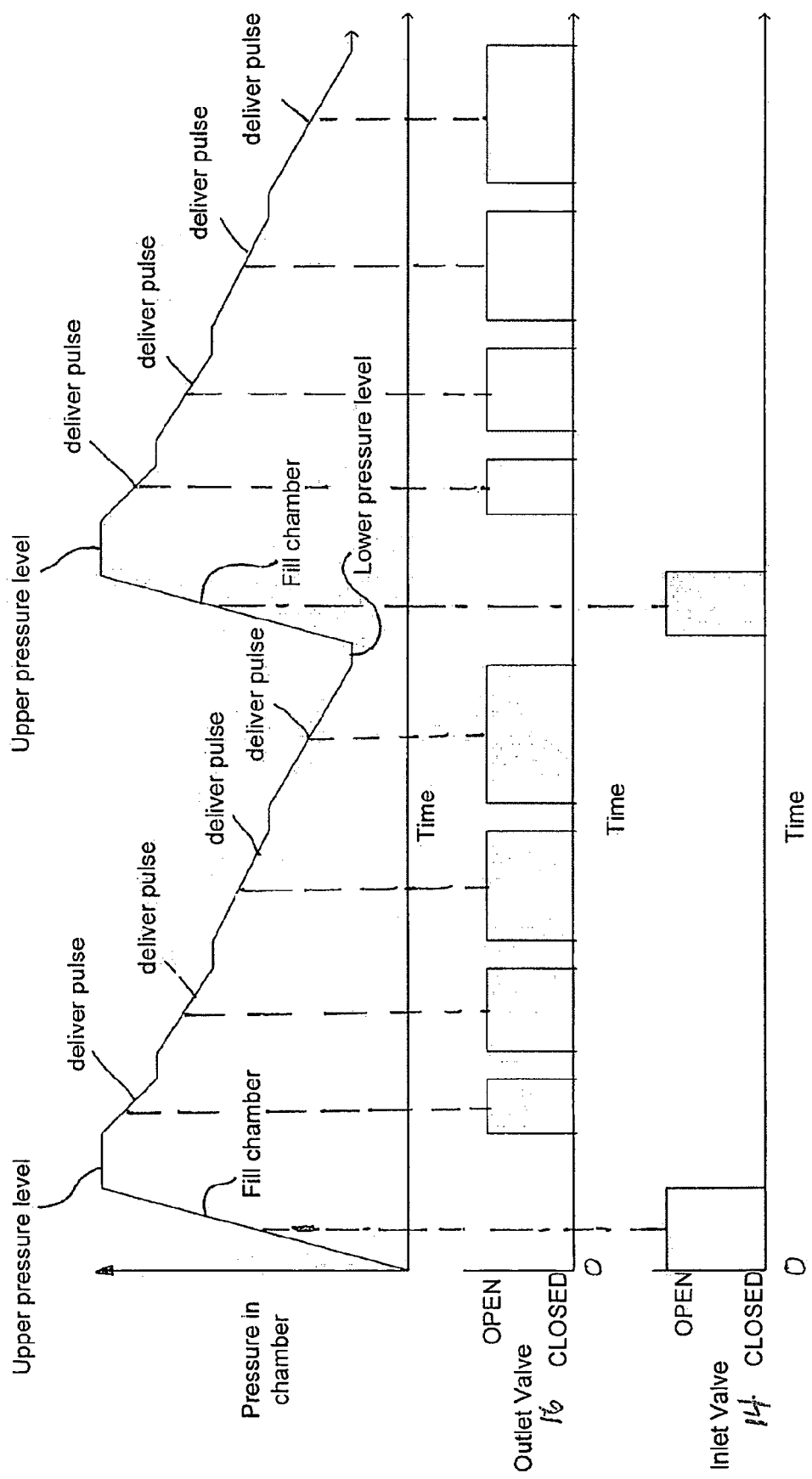
FIG. 4 is a graph of pressure within a chamber of the system of FIG. 1 versus time, and corresponding graphs of inlet and outlet valve operation of the system of FIG. 1 versus time, as the method of FIG. 3 is conducted.

FIG. 4 is a graph of pressure within a chamber 12 of the system 10 of FIG. 1 versus time, and corresponding graphs of operation of the inlet valve 14 and the outlet valve 16 of the system 10 of FIG. 1 versus time, as an example of the method 100 of FIG. 3 is conducted. The graphs in FIG. 4 are not meant to be accurate with respect to actual pressures and times, but are simply meant to illustrate how the outlet valve 16 is used much more often than the inlet valve 14 as the method 100 of FIG. 3 is conducted. As shown in FIG. 4, the inlet valve 14 is opened once to fill the chamber 12 to the upper pressure level, while the outlet valve 16 is opened multiple times to deliver the individual pulses of precursor gas from the chamber 12 before the chamber 12 falls to the lower pressure level. In this manner, the inlet valve 14 is used much less frequently than the outlet valve 16, since the inlet valve 14 is only opened to fill the chamber 12 and is not opened for each individual pulse of gas delivered.

The controller 24 is programmed to calculate a mass Δm for each pulse of gas delivered from the chamber 12. The mass m in the delivery chamber 12 based on the ideal gas law is:

$$m = \rho V = (P/RT)V \quad (1)$$

Where ρ equals density, V equals volume, P equals absolute pressure, T equals absolute temperature, and R is equal to the universal gas constant (8.3145 J/mol K).

The density dynamics within the delivery chamber 12 are:

$$d\rho/dt = -(Q_{out}\rho_{STP}/V) \quad (2)$$

Where $Q_{out}$ is the flow out of the delivery chamber 12, and $\rho_{STP}$ is the gas density under standard temperature and pressure (STP) conditions.

The temperature dynamics within the delivery chamber 12 are:

$$dT/dt = (\rho_{STP}/\rho V)Q_{out}(\gamma-1)T + (Nu\ \kappa/l)(A_w/VC_v\rho)(T_w - T) \quad (3)$$

Where γ is the ratio of specific heats, Nu is Nusslets number, κ is the thermal conductivity of the gas, $C_v$ is the specific heat under constant volume, l is the characteristic length of the delivery chamber, and $T_w$ is the temperature of the wall of the chamber 12 as provided by the temperature probe 20.

For high pressure applications, the temperature of the gas within the delivery chamber 12 of the system 10 can be measured using the temperature probe 20. For low pressure applications and fast temperature transients, however, using a probe to measure the temperature may not be fast enough for accurate readings. In the case of low pressure applications and fast temperature transients, a real-time physical model that estimates gas temperature may be used, as described below.

The outlet flow $Q_{out}$ can be estimated as follows:

$$Q_{out} = -(V/\rho_{STP})[(1/RT)(d\rho/dt)-(P/RT^2)(dT/dt)] \quad (4)$$

To compute the total mass delivered Δm from the chamber 12 during each pulse, equation (4) is substituted for $Q_{out}$ in equation (3) to calculate the gas temperature T(t), at time=t, within the chamber 12, as opposed to using the temperature probe 20 in FIG. 1. The pressure transducer 18 provides the pressure P(t), at time=t, within the chamber 12.

The total mass Δm delivered from the chamber 12 between time $t_0$ and time t* is:

$$\Delta m = m(t_0) - m(t^*) = V/R[(P(t_0)/T(t_0)) - (P(t^*)/T(t^*))] \quad (5)$$

Figure 7:
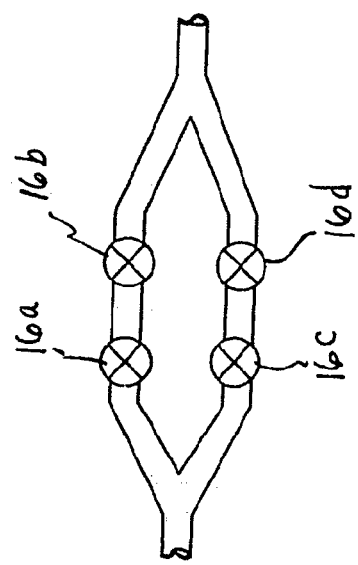
FIGS. 5-7 are schematic illustrations of exemplary embodiments of back-up valve arrangements for the outlet valve of the system of FIG. 1.
Figure 6:
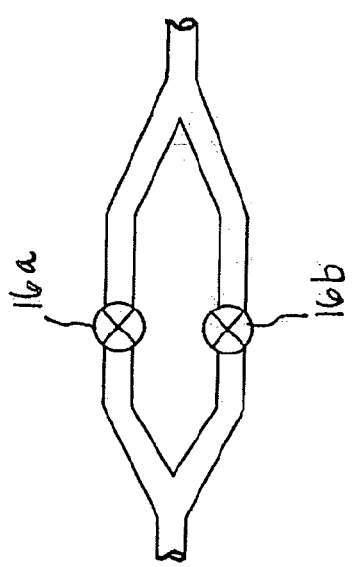
Figure 5:
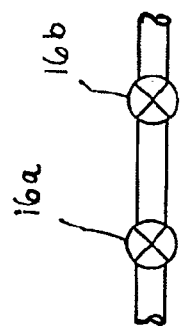

The present disclosure, accordingly, provides a new and improved system 10 and method 100 for delivering pulsed mass flows of precursor gases wherein the first, or inlet, valve 14 of the system is used less frequently, so that the inlet valve 14 will have an extended life. Referring to FIGS. 5-7, the present disclosure also provides exemplary embodiments of back-up valve arrangements for the outlet valve 16 of the system 10 of FIG. 1. According to one aspect of the present disclosure, the outlet valve 16 of the system 10 is replaced with at least two outlet valves 16a, 16b, wherein the second outlet valve 16b is only utilized upon failure of the first outlet valve 16a, so that the system 10 is even more reliable and downtime of semiconductor processing chambers using the system is minimized.

If the first outlet valve 16a is designed to fail in an open position, then the two outlet valves 16a, 16b are placed in series as shown in FIG. 5. If the first outlet valve 16a is designed to fail in a closed position, then the two valves 16a, 16b are placed in parallel as shown in FIG. 6. If the first outlet valve 16a is able to fail in either an open position or a closed position, then two valves 16a, 16b in series are placed in parallel with two additional valves 16c, 16d in series, as shown in FIG. 5.

Among further aspects and advantages, the present disclosure provides a new and improved system 10 and method 100 for delivering pulsed mass flows of precursor gases into semiconductor processing chambers. The mass flow delivery system 10 and method 100 actually measure the amount of material (mass) flowing into the process chamber. In addition, the system 10 and method 100 provide highly repeatable and precise quantities of gaseous mass for use in semiconductor manufacturing processes, such as atomic layer deposition (ALD) processes. Using the precise measurement of mass delivered, the system can select when to switch to another valve as shown in FIGS. 5, 6 or 7.

The exemplary embodiments described in this specification have been presented by way of illustration rather than limitation, and various modifications, combinations and substitutions may be effected by those skilled in the art without departure either in spirit or scope from this disclosure in its broader aspects and as set forth in the appended claims.

What is claimed is:

1. A system for delivering pulses of gas, wherein each pulse comprises a desired mass of the gas, comprising:
   a chamber;
   a first valve controlling gas flow into the chamber;
   a second valve controlling gas flow out of the chamber;
   a pressure transducer providing measurements of pressure within the chamber;
   an input interface for providing a desired mass for each pulse of gas to be delivered by the system;
   a controller connected to the valves, the pressure transducer and the input interface and configured and arranged to,
     receive the desired mass of gas through the input interface,
     receive chamber pressure measurements from the pressure transducer,
     fill the chamber whenever the pressure within the chamber falls to a predetermined lower level by closing the second valve, opening the first valve until the pressure within the chamber rises to a predetermined upper level, wherein the first valve is closed, and
     deliver successive pulses of gas from the chamber by opening and closing the second valve after the first valve has been closed and whenever the pressure within the chamber is greater than the predetermined lower level, wherein each pulse is delivered by opening the second valve at time=$t_0$, and closing the second valve at time=t* when the mass of gas discharged equals the desired mass, wherein the controller calculates the mass discharged when the second valve is open, and wherein the mass discharged, Δm, for each pulse is equal to, $$\Delta m = m(t_0) - m(t^*) = V/R[(P(t_0)/T(t_0)) - (P(t^*)/T(t^*))]$$

wherein $m(t_0)$ is the mass of the gas in the chamber at time=$t_0$, m(t*) is the mass of the gas in the chamber at time=t*, V is the volume of the chamber, R is equal to the universal gas constant (8.3145 J/mol K), $P(t_0)$ is the pressure in the chamber at time=$t_0$, P(t*) is the pressure in the chamber at time=t*, wherein for delivery of the mass of gas, the outlet valve is open for a time of about 100 milliseconds to about 500 milliseconds.

2. A system according to claim 1, further comprising a temperature probe secured to the delivery chamber and connected to the controller, wherein the temperature probe directly provides $T(t_0)$ and T(t*) to the controller.

3. A system according to claim 1, further comprising a temperature probe secured to the delivery chamber and connected to the controller and wherein $T(t_0)$ and T(t*) are calculated using:

$$dT/dt = (\rho_{STP}/\rho V)Q_{out}(\gamma-1)T + (Nu\ \kappa/l)(A_w/VC_v\rho)(T_w-T)$$

where $\rho_{STP}$ is the gas density under standard temperature and pressure (STP) conditions, ρ equals the density of the gas, V is the volume of the chamber, $Q_{out}$ is the gas flow out of the chamber, T equals absolute temperature, γ is the ratio of specific heats, Nu is Nusslets number, κ is the thermal conductivity of the gas, $C_v$ is the specific heat of the gas under constant volume, l is the characteristic length of the delivery chamber, and $T_w$ is the temperature of the wall of the chamber as provided by the temperature probe.

4. A system according to claim 3, wherein the gas flow out of the chamber is calculated using:

$$Q_{out} = -(V/\rho_{STP})[(1/RT)(d\rho/dt)-(P/RT^2)(dT/dt)].$$

5. A system according to claim 1, wherein the predetermined upper level of pressure and the predetermined lower level of pressure are provided through the input interface.

6. A system according to claim 1, wherein the controller is also programmed to wait a predetermined waiting period after the first valve has been closed in order to allow the gas inside the chamber to approach a state of equilibrium prior to delivering pulses from the chamber using the second valve.

7. A system according to claim 6, wherein the predetermined waiting period is provided through the input interface.

8. A system according to claim 1, further comprising an output interface connected to the controller and the controller is programmed to provide the mass of gas discharged during each pulse to the output interface.

9. A system according to claim 1, further comprising a process chamber connected to the delivery chamber through the second valve.

10. A system according to claim 1, wherein the pressure transducer has a response time of about 1 to 5 milliseconds.

11. A system according to claim 1, wherein the second valve has a response time of about 1 to 5 milliseconds.

12. A system according to claim 1, wherein the second valve comprises two valves arranged in series.

13. A system according to claim 1, wherein the second valve comprises two valves arranged in parallel.

14. A system according to claim 1, wherein the second valve comprises a first pair of valves arranged in series and a second pair of valves arranged in series, wherein the first and the second pair of valves are arranged in parallel.

15. A system according to claim 1, wherein the controller is also programmed to receive from the input interface a desired number of pulses to be delivered, and refill the chamber and deliver pulses of gas from the chamber until the number of delivered pulses is equal to the desired number of pulses.

16. A computer-executable program product for controlling a dynamic gas flow controller for delivering pulses of gas, wherein each pulse comprises a desired mass of the gas, and wherein the controller is operatively connected to a system including (i) a chamber, (ii) a first valve controlling gas flow into the chamber, (iii) a second valve controlling gas flow out of the chamber, (iv) a pressure transducer providing measurements of pressure within the chamber, and (v) and input interface for providing a desired mass for each pulse of gas, the program product comprising a computer readable storage medium, which when loaded in the controller causes the controller to:

receive a value of the desire mass of gas through the input interface;

receive chamber pressure measurements from the pressure transducer;

fill the chamber whenever the pressure within the chamber falls to a predetermined lower level by closing the second valve, opening the first valve until the pressure within the chamber rises to a predetermined upper level, wherein the first valve is closed; and deliver successive pulses of gas from the chamber by opening and closing the second valve after the first valve has been closed and whenever the pressure within the chamber is greater than the predetermined lower level, wherein each pulse is delivered by opening the second valve at time=$t_0$, and closing the second valve at time=$t^*$ when the mass of gas discharged equals the desired mass, wherein the controller calculates the mass discharged when the second valve is open, and wherein the mass discharged, $\Delta m$, for each pulse is equal to, $$\Delta m = m(t_0) - m(t^*) = V/R[(P(t_0)/T(t_0)) - (P(t^*)/T(t^*))]$$

wherein $m(t_0)$ is the mass of the gas in the chamber at time=$t_0$, $m(t^*)$ is the mass of the gas in the chamber at time=$t^*$, V is the volume of the chamber, R is equal to the universal gas constant (8.3145 J/mol K), $P(t_0)$ is the pressure in the chamber at time=$t_0$, $P(t^*)$ is the pressure in the chamber at time=$t^*$, $T(t_0)$ is the temperature in the chamber at time=$t_0$, $T(t^*)$ is the temperature in the chamber at time=$t^*$, wherein for delivery of the mass of gas, the outlet valve is open for a time of about 100 milliseconds to about 500 milliseconds.

17. The program product of claim 16, wherein the system further comprises a temperature probe secured to the chamber and connected to the controller, and wherein $T(t_0)$ and $T(t^*)$ are calculated by the controller using:

$$dT/dt = (\rho_{STP}/\rho V)Q_{out}(\gamma-1)T + (Nu\, \kappa/l)(A_w/VC_v\rho)(T_w - T)$$

where $\rho_{STP}$ is the gas density under standard temperature and pressure (STP) conditions, $\rho$ equals the density of the gas, V is the volume of the chamber, $Q_{out}$ is the gas flow out of the chamber, T equals absolute temperature, $\gamma$ is the ratio of specific heats, Nu is Nusslets number, $\kappa$ is the thermal conductivity of the gas, $C_v$ is the specific heat of the gas under constant volume, l is the characteristic length of chamber, and $T_w$ is the temperature of the wall of the chamber as provided by the temperature probe.

* * * * *

UNITED STATES PATENT AND TRADEMARK OFFICE
CERTIFICATE OF CORRECTION

| | | |
|---|---|---|
| PATENT NO. | : 7,628,861 B2 | Page 1 of 1 |
| APPLICATION NO. | : 11/015465 | |
| DATED | : December 8, 2009 | |
| INVENTOR(S) | : William R. Clark | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 279 days.

Signed and Sealed this

Second Day of November, 2010

David J. Kappos
*Director of the United States Patent and Trademark Office*